United States Patent
Berman

(10) Patent No.: US 11,791,840 B1
(45) Date of Patent: Oct. 17, 2023

(54) HARD DECISION DECODING OF NON-VOLATILE MEMORY USING MACHINE LEARNING

(71) Applicant: SAMSUNG ELECTRONICS CO., LTD., Suwon-si (KR)

(72) Inventor: Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/720,941

(22) Filed: Apr. 14, 2022

(51) Int. Cl.
*H03M 13/11* (2006.01)
*G06N 3/063* (2023.01)
*G11C 7/10* (2006.01)

(52) U.S. Cl.
CPC ........ *H03M 13/1108* (2013.01); *G06N 3/063* (2013.01); *G11C 7/1063* (2013.01); *G11C 7/1069* (2013.01); *H03M 13/1125* (2013.01)

(58) Field of Classification Search
None
See application file for complete search history.

(56) References Cited

U.S. PATENT DOCUMENTS

| | | |
|---|---|---|
| 10,573,390 B1 | 2/2020 | Berman |
| 2021/0096751 A1 | 4/2021 | Berman |
| 2022/0013189 A1 | 1/2022 | Berman et al. |
| 2022/0116057 A1 | 4/2022 | Doubchak et al. |

*Primary Examiner* — Guerrier Merant
(74) *Attorney, Agent, or Firm* — F. Chau & Associates, LLC

(57) ABSTRACT

A memory system includes a plurality of memory cells each storing multiple bits and a memory controller having a processor. The memory controller is configured to read outputs from the memory cells in response to a read command from a host to generate first raw data of a first page and second raw data of a second page adjacent to the first page. The memory controller is further configured to perform a hard decision (HD) decoding on the first raw data to generate first decoded data. The processor is configured to apply the first decoded data and the second raw data as input features to a machine learning algorithm to generate reliability information. The memory controller is further configured to perform a HD decoding on the second raw data using the reliability information to generate second decoded data.

20 Claims, 14 Drawing Sheets

FIG. 8B

Algorithm 1: Decoding with Neighbor page, 4-levels MLC

(1) $RawP_1 \leftarrow$ Read raw data page with $\{Ref_{0,1}, Ref_{2,3}\}$
(2) $DataP_1 \leftarrow$ HD Decoding of $RawP_1$ with default LLR
(3) $RawP_2 \leftarrow$ Read raw data page with $\{Ref_{1,2}\}$
(4) $llrP_2 \leftarrow$ Estimate LLR of $P_2$ with Neural-Network using input of $DataP_1$ and $RawP_2$
(5) $DataP_2 \leftarrow$ Decode $RawP_2$ with $llrP_2$

FIG. 10B

Algorithm 2: Decoding with Neighbor page, 8-levels TLC (1) $RawP_1 \leftarrow$ Read raw data page with $\{Ref_{1,2}, Ref_{3,4}, Ref_{5,6}\}$
(2) $DataP_1 \leftarrow$ Decode $RawP_1$ with default LLR
(3) $RawP_2 \leftarrow$ Read raw data page with $\{Ref_{2,3}, Ref_{6,7}\}$
(4) $llrP_2 \leftarrow$ Estimate LLR of $P_2$ with Neural-Network using input of $DataP_1$ and $RawP_2$
(5) $DataP_2 \leftarrow$ Decode $RawP_2$ with $llrP_2$
(6) $RawP_3 \leftarrow$ Read raw data page with $\{Ref_{3,1}, Ref_{4,5}\}$
(7) $llrP_3 \leftarrow$ Estimate LLR with Neural-Network using input of $DataP_1$, $DataP_2$ and $RawP_3$
(8) $DataP_3 \leftarrow$ Decode $RawP_3$ with $llrP_3$

HARD DECISION DECODING OF NON-VOLATILE MEMORY USING MACHINE LEARNING

TECHNICAL FIELD

Exemplary embodiments of the present inventive concept relate to error detection and correction using machine learning, and a more particularly to hard decision decoding on a non-volatile memory using machine learning.

DISCUSSION OF RELATED ART

Modern non-volatile memory devices such as NAND flash memory devices allow for several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels. NAND flash memories have bit errors that may be corrected by use of an error correction code (ECC).

Power consumption is a significant factor to consider when designing a non-volatile memory (NVM) system, which may include NAND flash memories. For example, a memory controller of the NVM system could use about 100 milliwatts of power per channel. The memory controller may use an error correction decoder to perform error correction using the ECC. However, most power expended by the memory controller is a result of using the error correction decoder.

SUMMARY

According to an exemplary embodiment of the inventive concept a memory system is provided. The memory system includes a memory device and a memory controller. The memory device includes a plurality of memory cells each storing multiple bits. The memory controller includes a processor. The memory controller is configured to read outputs (e.g., channel output) from the memory cells in response to a read command from a host and generate first raw data of a first page and second raw data of a second page adjacent to the first page (e.g., adjacent pages connected to same wordline). The memory controller is further configured to perform a HD decoding on the first raw data to generate first decoded data. The processor applies the first decoded data and the second raw data as input features to a machine learning (ML) algorithm to generate reliability (or side) information. The memory controller is further configured to perform a HD decoding on the second raw data using the reliability information to generate second decoded data.

According to an exemplary embodiment of the inventive concept a computer-implemented method for controlling a memory system is provided. The memory system includes a memory device having a plurality of memory cells each storing multiple bits and a memory controller including a processor. The method includes the memory controller reading outputs from the memory cells in response to a read command from a host to generate first raw data of a first page and second raw data of a second page adjacent to the first page. The method further includes the memory controller performing a hard decision (HD) decoding on the first raw data to generate first decoded data. The method further includes the processor applying the first decoded data and the second raw data as input features to a machine learning algorithm to generate reliability information. The method further includes the memory controller performing a hard decision (HD) decoding on the second raw data using the reliability information to generate second decoded data.

According to an exemplary embodiment of the inventive concept, a memory system is provided. The memory system includes a memory device and a memory controller. The memory device includes a plurality of triple-level memory cells (TLCs). The memory controller includes a processor. The memory controller is configured to read outputs from the memory cells in response to a read command from a host to generate first raw data of a first page, second raw data of a second page adjacent to the first page, and third raw data of a second page adjacent to the first page. The memory controller is further configured to perform a first decoding on the first raw data to generate first decoded data. The processor is configured to apply the first decoded data and the second raw data as input features to a first machine learning algorithm to generate first reliability information. The memory controller is further configured to perform a second decoding on the second raw data using the first reliability information to generate second decoded data. The processor is configured to apply the first decoded data, the second decoded data, and the third raw data as input features to a second machine learning algorithm to generate second reliability information for use in decoding the third raw data.

BRIEF DESCRIPTION OF THE DRAWINGS

The above and other features of the present inventive concept will become more apparent by describing in detail exemplary embodiments thereof with reference to the accompanying drawings, in which:

FIG. 8B illustrates pseudocode of an algorithm associated with the method of FIG. 8A.

FIG. 10B illustrates pseudocode of an algorithm associated with the method of FIG. 10.

DETAILED DESCRIPTION

Figure 1:
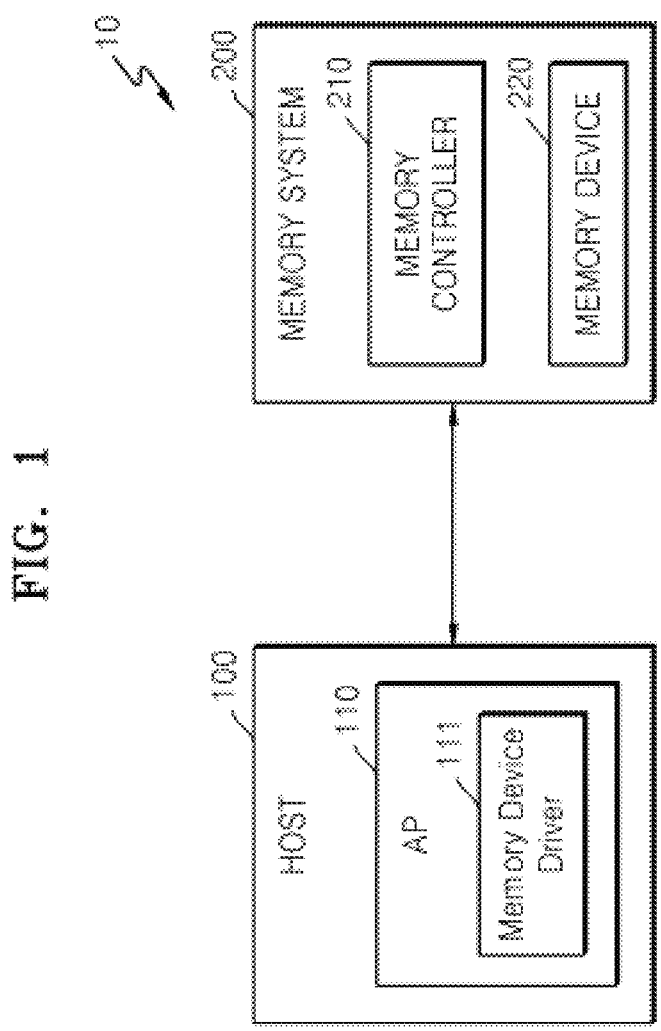
FIG. 1 is a block diagram illustrating an implementation of a data processing system including a memory system, according to an exemplary embodiment of the inventive concept.

Exemplary embodiments of the present inventive concept will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the non-volatile memory system 200. The host 100 may communicate with the non-volatile memory system 200 to transmit a command (e.g., a read command, a write command, an erase command, etc.) related to a memory operation and receive a confirm command in response to the transmitted command.

The non-volatile memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
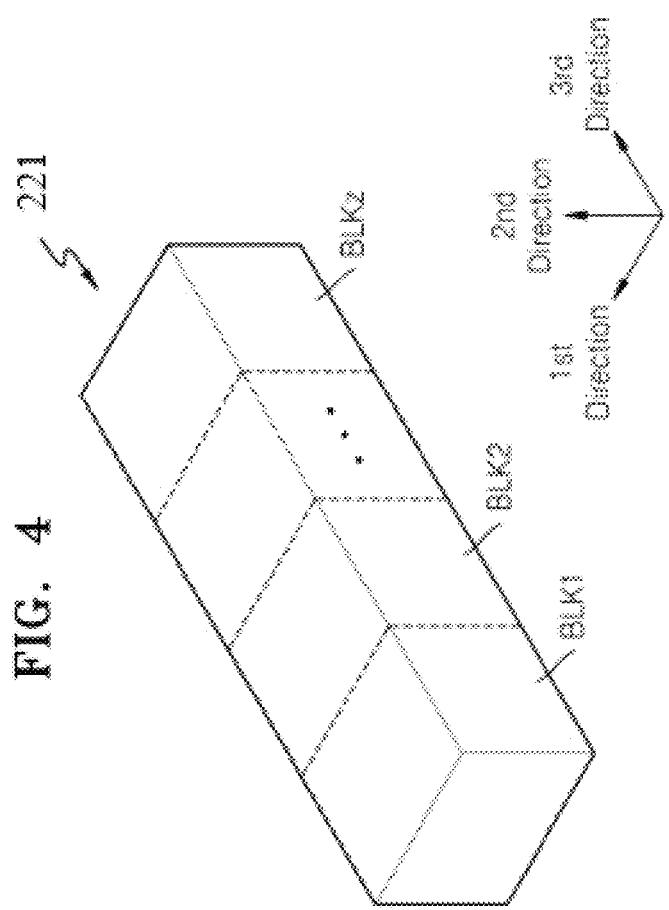
FIG. 4 is a block diagram of the memory cell array of FIG. 2, according to an exemplary embodiment of the inventive concept.

The memory device 220 may include a memory cell array that retains data stored therein, even when the memory device 220 is not powered on. The memory cell array may include as memory cells, for example, a NAND or NOR flash memory, a magnetoresistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
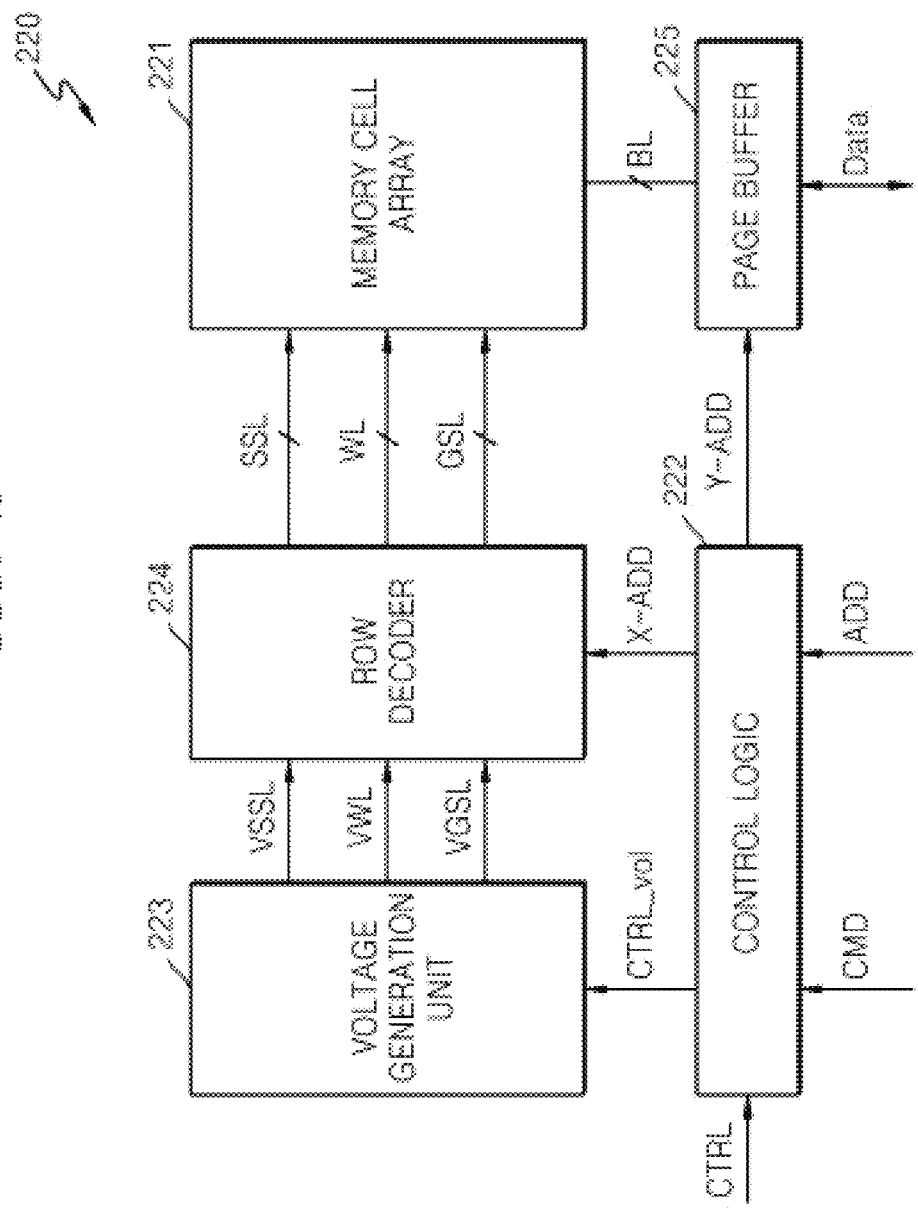
FIG. 2 is a detailed block diagram of a non-volatile memory device of FIG. 1, according to an exemplary embodiment of the inventive concept.

FIG. 2 is a detailed block diagram of the non-volatile memory device 220 of FIG. 1, according to an exemplary embodiment of the inventive concept.

Referring to FIG. 2, the non-volatile memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the non-volatile memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 3:
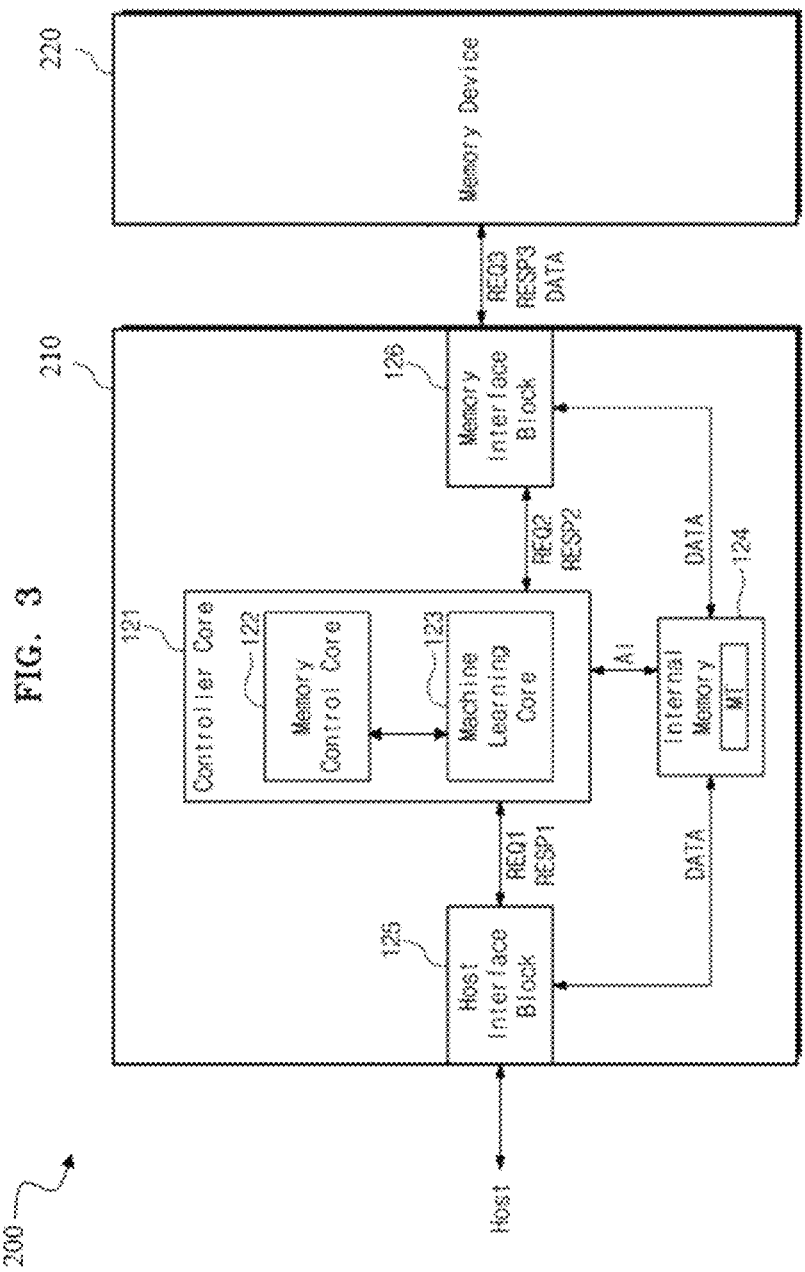
FIG. 3 is a block diagram illustrating the memory system of FIG. 1, according to an exemplary embodiment of the inventive concept.

FIG. 3 is a block diagram illustrating the memory system 200 of FIG. 1, according to an exemplary embodiment of the inventive concept.

Referring to FIG. 3, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 121, an internal memory 124, a host interface block 125, and a memory interface block 126.

The controller core 121 may include a memory control core 122 and a machine learning core 123, and each of these cores may be implemented by one or more processors. The memory control core 122 may control and access the memory device 220 depending on a request received from the host 100 or an internally designated schedule. The memory control core 122 may manage and execute various metadata and codes used to manage or operate the memory system 200. In an exemplary embodiment of the inventive concept, the memory control core 122 includes an error correction code (ECC) circuit to perform error detection and correction on data read from memory cells of the memory device 220. For example, the memory control core 122 may sense read voltages from a subset of the memory cells in response to a read command and address information received from a Host, convert the read voltages into a codeword (including data and redundancy information), and perform an ECC operation on the codeword using the ECC circuit. The memory control core 122 may alternately perform the error detection and correction (i.e., the ECC operation) using an ECC algorithm. The error correction capability of the ECC circuit or the ECC algorithm may be a certain number of bit errors. When the error correction capability has been exceeded, the memory control core 122 is unable to correct the detected errors. Thus, upon reading data from selected memory cells based on the address information and the read command, the memory control core 122 may need to report that the data has been corrupted and cannot be read or corrected.

However, according to an exemplary embodiment of the inventive concept, the machine learning core 123 determines side information on reliable page bits of a codeword read from a memory device, and outputs the side information to an ECC circuit or an ECC algorithm for detecting and correcting errors in the codeword. In an exemplary embodiment, the side information includes at least one log-likelihood ratio (LLR) for a corresponding bit of the codeword.

The machine learning core 123 may execute a machine learning algorithm that receives decoded page data of one or more neighbouring pages (e.g., pages connected to a same wordline) and raw data for another neighbouring page as inputs to generate the side information. In an embodiment where memory cells of the memory device store 4-level data (e.g., DLCs or MLCs), the decoded page data is most significant bit (MSB) data of a MSB page, the raw page data is least significant bit (LSB) data of a LSB page, and the side information is for the LSB data. In an embodiment where memory cells of the memory device store 8-level data (TLCs), the decoded page data includes LSB data of the LSB page and center significant bit (CSB) data of a CSB page, the raw page data is MSB data of a MSB page, and the side information is for the MSB data. While, examples are provided below with respect to DLC or MLC (e.g., 2 bits per cell) and TLC (e.g., 3 bits per cell), the inventive concept is not limited thereto and may be applied to any memory cell capable of storing multiple bits such as a quad-level cell (QLC) that contains four bits per cell or 16-level data and to a penta-level cell (PLC) that contains five bits per cell or 32-level data.

The machine learning algorithm may be implemented in hardware, software, or a combination of hardware and software. While the machine learning algorithm will be discussed below as an artificial neural network (or a neural network) for ease of understanding the inventive concept, embodiments of the inventive concept are not limited thereto. For example, the machine learning algorithm could be implemented by a decision tree. If the ECC circuit or ECC algorithm performed on the codeword fails, the controller core 121 can log and/or report that an error has occurred.

The internal memory 124 may be used, for example, as a system memory which is used by the controller core 121, a cache memory which stores data of the memory device 220, or a buffer memory which temporarily stores data between the host 100 and the memory device 220. The internal memory 124 may store a mapping table MT that indicates a relationship between logical addresses from the Host assigned to the memory system 200 and physical addresses of the memory device 220. The internal memory 124 may include, for example, a dynamic random access memory (DRAM) or a static random access memory (SRAM).

In an exemplary embodiment, a neural network, such as the neural network described with reference to FIG. 11A and FIG. 11B, may be included in a computer program which is stored in the internal memory 124 of the memory controller 210 or in the memory device 220. The computer program including the neural network may be executed by the machine learning core 123 to generate the side information used by an ECC operation of the memory control core 122. Alternately, the neural network may be implemented in hardware. For example, the machine learning core 123 may include one or more logic circuits representing the neural network. Thus, according to exemplary embodiments, the memory system 200 may error correct data stored in the memory device 220 during a normal read operation of the memory device 220. That is, after manufacture of the memory system 200 is complete, during normal operation of the memory system 200, and particularly, during a normal read operation of the memory system 200 in which data is read from the memory device 220, the data stored in the memory device 220 that is being read may be error corrected using information received from the neural network locally stored and executed in the memory system 200, and the error corrected data may be read out from the memory device 220.

The host interface block 125 may include a component for communicating with the host 100 such as, for example, a physical block. The memory interface block 126 may include a component for communicating with the memory device 220 such as, for example, a physical block.

Below, an operation of the memory system 200 over time will be described. When power is supplied to the memory system 200, the memory system 200 may perform initialization with the host 100.

The host interface block 125 may provide the memory control core 122 with a first request REQ1 received from the host 100. The first request REQ1 may include a command (e.g., a read command or a write command) and a logical address. The memory control core 122 may translate the first request REQ1 to a second request REQ2 suitable for the memory device 220.

For example, the memory control core 122 may translate a format of the command. The memory control core 122 may obtain address information AI with reference to the mapping table MT stored in the internal memory 124. The memory control core 122 may translate a logical address to a physical address of the memory device 220 by using the address information AI. The memory control core 122 may provide the second request REQ2 suitable for the memory device 220 to the memory interface block 126.

The memory interface block 126 may register the second request REQ2 from the memory control core 122 at a queue. The memory interface block 126 may transmit a request that is first registered at the queue to the memory device 220 as a third request REQ3.

When the first request REQ1 is a write request, the host interface block 125 may write data received from the host 100 to the internal memory 124. When the third request REQ3 is a write request, the memory interface block 126 may transmit data stored in the internal memory 124 to the memory device 220.

When data is completely written, the memory device 220 may transmit a third response RESP3 to the memory interface block 126. In response to the third response RESP3, the memory interface block 126 may provide the memory control core 122 with a second response RESP2 indicating that the data is completely written.

After the data is stored in the internal memory 124 or after the second response RESP2 is received, the memory control core 122 may transmit a first response RESP1 indicating that the request is completed to the host 100 through the host interface block 125.

When the first request REQ1 is a read request, the read request may be transmitted to the memory device 220 through the second request REQ2 and the third request REQ3. The memory interface block 126 may store data received from the memory device 220 in the internal memory 124. When data is completely transmitted, the memory device 220 may transmit the third response RESP3 to the memory interface block 126.

As the third response RESP3 is received, the memory interface block 126 may provide the memory control core 122 with the second response RESP2 indicating that the data is completely stored. As the second response RESP2 is received, the memory control core 122 may transmit the first response RESP1 to the host 100 through the host interface block 125.

The host interface block 125 may transmit data stored in the internal memory 124 to the host 100. In an exemplary embodiment, in the case in which data corresponding to the first request REQ1 is stored in the internal memory 124, the transmission of the second request REQ2 and the third request REQ3 may be omitted.

Figure 5:
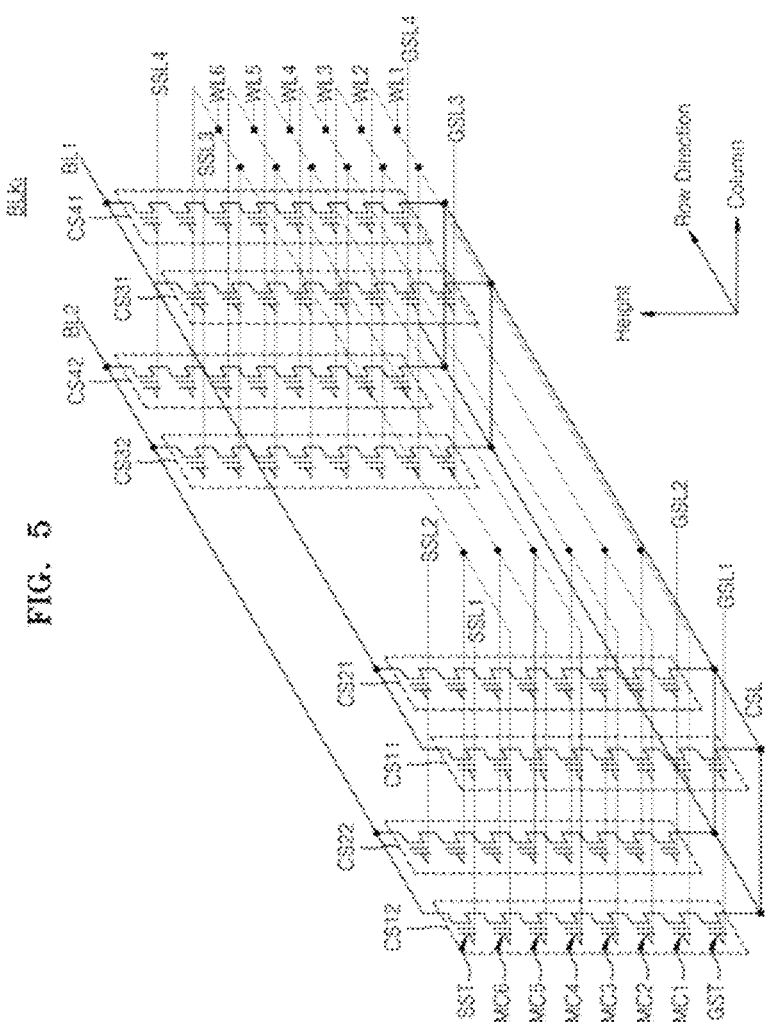
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

At least one embodiment of the inventive concept provides a decoding method that may reduce the average number of decoder iterations per page read, thereby reducing energy consumption. This reduction in energy consumption may be achieved by providing side information of reliable page bits to the decoder. When reading sequential pages that are located on the same wordline, the decoded data of one page can indicate reliable bits in another neighbouring page due to a limited magnitude error property of the NVM channel. For example, the probability of a level i (e.g., a programmed or erase level) being shifted to levels i+1 or i=1 is substantially higher than shifting to non-sequential levels. The decoding method may be referred to as decoding with neighbour page side information.

Figure 6:
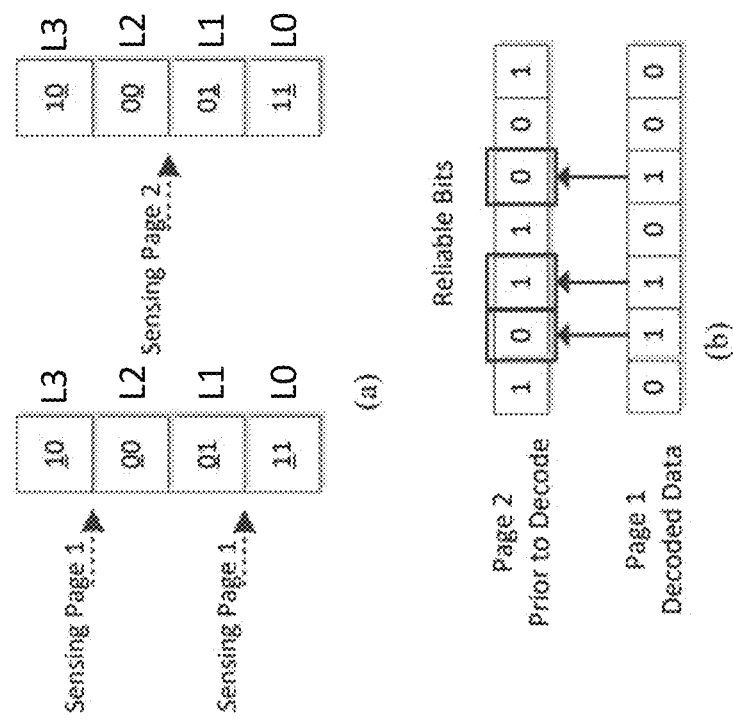
FIG. 6 illustrates utilizing neighbour page data to mark reliable bits in a 4-level or double-level cell (DLC), according to an exemplary embodiment of the inventive concept.

FIG. 6 illustrates utilizing neighbour page data to mark reliable bits in a 4-level or multi-level cell (DLC or MLC), according to an exemplary embodiment of the inventive concept. For example, in part (a) of FIG. 6, a 4-level DLC or MLC is considered where the first page is stored on the cell's MSB and the second page is stored on the cell's LSB. It is assumed that the first page (i.e., the MSB page) is read and decoded successfully. All page indices that store 1 are cells at either level 0 (erased) or 3. If data read from a level 0 cell is an error, it is most likely to be level 1 that has been shifted. Likewise, errors in data read from a level 3 cell are likely to have resulted from a shifted level 2. Observing a cell's LSB, level 0 and level 1 represent the same data 1, and levels 2 and 3 represent 0. Therefore, the first page indices that store 1 imply that the corresponding index at the second-page store reliable bits. Part (b) of FIG. 6 depicts decoded first-page data (MSB data) and second-page raw data (e.g., LSB data before ECC decoding). The bits at indices 2, 3, and 5 on the second page (0, 1, and 0) are considered to be reliable. Those bits may be assigned with a high or maximum LLR, which can accelerate decoder iteration convergence. If bits are uniformly distributed (e.g., a randomizer is used during a page write), the described example passes 50% reliable bits of the second page (LSB data) to an iterative decoder.

Figure 7:
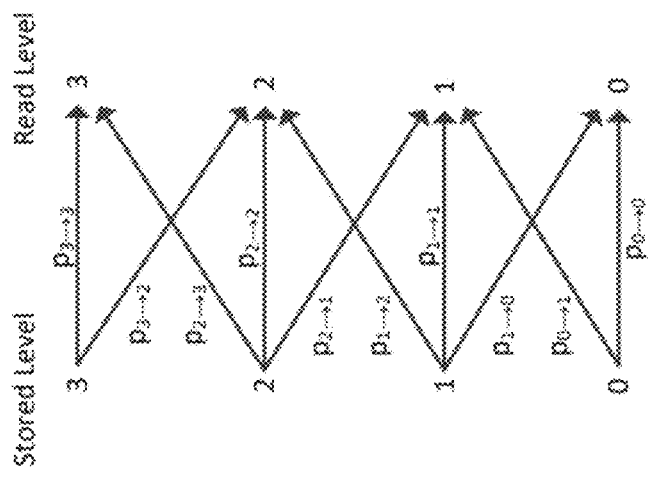
FIG. 7 illustrates a flash NVM channel for 4-level memory cells presenting a limited magnitude shift.

The limited magnitude error of the flash NVM channel is shown in FIG. 7. The probability that errors are not limited magnitude (e.g., level 1 is shifted to level 3) is substantially less than the adjacent level. If this probability is not negligible, the LLR of indices with 1 in a neighbour page can be tuned to a higher value, although not the maximum.

In an embodiment, the described side information is available only if the previous read address was mapped to the same wordline. Such a read pattern is common during garbage collection, where valid sectors are copied to an erased block.

Another possible setting is where the dynamic-random-access memory (DRAM) cache stores several pages and at least one shares a similar wordline with the selected NAND read address.

Figure 8A:
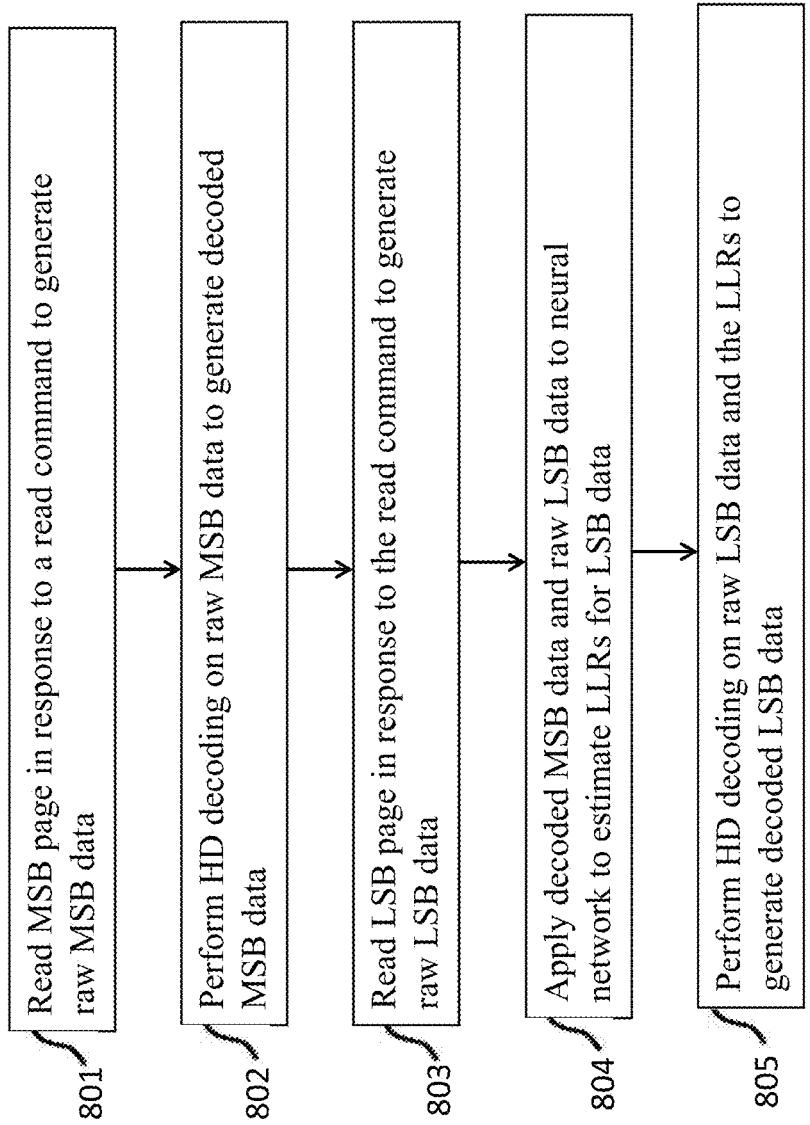
FIG. 8A illustrates a method of decoding data for 4-level memory cells, according to an exemplary embodiment of the inventive concept.

FIG. 8A illustrates a method of correcting data for 4-level DLCs or MLCs according to an exemplary embodiment of the inventive concept and FIG. 8B illustrates pseudo-code for performing the method of FIG. 8A.

The method of FIG. 8A includes reading an MSB page in response to a read command to generate raw MSB data (step 801). The read command may be received by the memory controller 210 from the Host along with a read address. The read address may indicate the location of the MSB page and a LSB page of the memory device 220. Memory cells of the MSB page and the LSB are connected to a same wordline. The reading may correspond to step (1) of FIG. 8B. In an embodiment, the reading includes performing a first reference comparison $Ref_{0-1}$ and a second reference comparison $Ref_{2-3}$ with respect to outputs of the memory device 220 output during the reading to generate the raw MSB data. The raw MSB data may correspond to $RawP_1$ in FIG. 8B. The first reference comparison $Ref_{0-1}$ compares the read outputs to a voltage level between levels 0 and 1 and is represented by the lower left arrow in part (a) of FIG. 6. The second reference comparison $Ref_{2-3}$ compares the read outputs to a voltage level between levels 2 and 3 and is represented by the upper left arrow in part (a) of FIG. 6. The reading may be performed by the controller core 121 or the memory control core 122.

The method of FIG. 8A further includes performing hard decision (HD) decoding on the raw MSB data to generate decoded MSB data (S802). The HD decoding may perform error detection and correction. The HD decoding may correspond to step (2) of FIG. 8B. In an exemplary embodiment, the HD decoding decodes the MSB data using a default LLR. The decoded MSB data may corresponds to $DataP_1$ in FIG. 8B. The HD decoding may be performed by the controller core 121 or the memory control core 122. The HD decoding may be performed by a generalized low-density parity-check (GLDPC) decoder.

The method of FIG. 8A further includes reading an LSB page in response to the read command to generate raw LSB data (step 803). In an embodiment, step 803 may occur before step 802. The reading may correspond to step (3) of FIG. 8B. In an embodiment, the reading includes performing a third reference comparison $Ref_{1-2}$ with respect to the read outputs to generate the raw LSB data. The raw LSB data may corresponds to $RawP_2$ in FIG. 8B. The third reference comparison $Ref_{1-2}$ compares the read outputs to a voltage level between levels 1 and 2 and is represented by the lower arrow in part (a) of FIG. 6. The reading may be performed by the controller core 121 or the memory control core 122.

The method of FIG. 8A includes applying the decoded MSB data and the raw LSB data as inputs to a neural network to estimate LLRs for the LSB data (step 804). Step (4) of FIG. 8B may correspond to the application of the inputs to the neural network. The estimated LLRs may corresponds to $llrP_2$ in FIG. 8B. For example, if the LSB data includes 32 bits of data, then 32 LLRs or one for each bit may be output by the neural network. The machine learning core 123 may receive the decoded MSB data and the raw LSB data from the memory control core 122 and apply them as inputs to the neural network.

The method of FIG. 8A includes performing HD decoding on the raw LSB data and the LLRs to generate decoded LSB data (step 805). The HD decoding may correspond to step (5) of FIG. 8B. In an exemplary embodiment, the HD decoding decodes the LSB data using the LLRs $llrP_2$ received from the machine learning core 123. The decoded LSB data may corresponds to $DataP_2$ in FIG. 8B. The HD decoding may be performed by the controller core 121 or the memory control core 122.

Assuming the HD decodings were successful, the decoded MSB data and decoded LSB data may then be output to the Host through the Host Interface Block 125. If the MSB data was decoded but the LSB data could not be decoded, the memory controller 210 may log an error or report the error to the Host.

Figure 9:
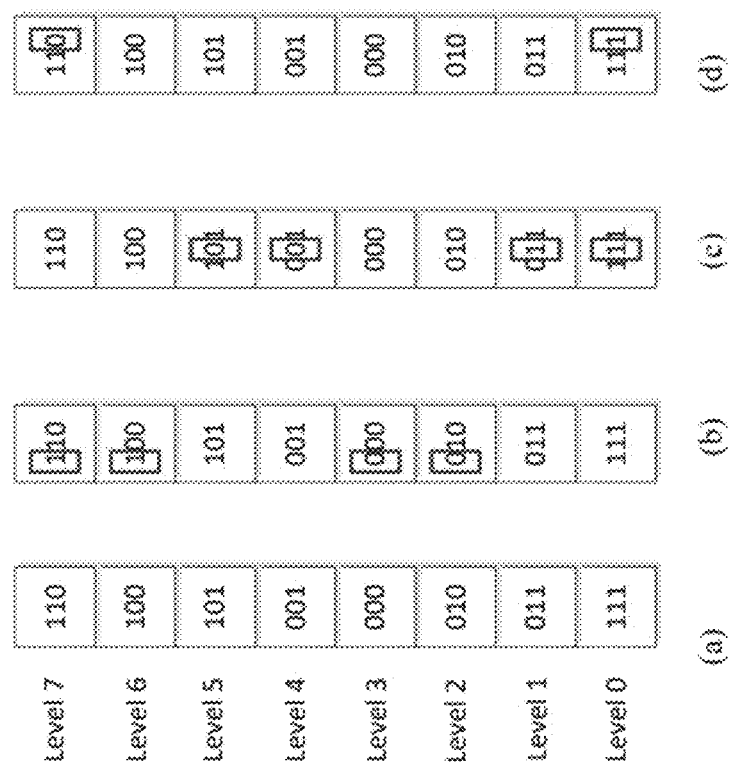
FIG. 9 illustrates utilizing neighbour page data to mark reliable bits in an 8-level or triple-level cell (TLC), according to an exemplary embodiment of the inventive concept.

FIG. 9 illustrates utilizing neighbour page data to mark reliable bits in an 8-level or triple-level cell (TLC). Part (a) of FIG. 9 illustrates mapping of bits to 8-level TLCs.

Part (b) of FIG. 9 illustrates reliable bits (e.g., bits that have a similar value at adjacent levels) for a MSB page. In part (b) of FIG. 9, the reliable bits (i.e., adjacent levels have the same value) are located at levels 2, 3, 6, and 7. Those bits are identified only by the LSB page, in its indices that store 0's.

Part (c) of FIG. 9 illustrates reliable bits for a CSB page. In part (c) of FIG. 9, the page that the CSB represents has reliable bits at levels 0, 1, 4, and 5. Those bits can be identified only by the LSB page, in its indices that store 1's. Part (d) of FIG. 9 illustrates reliable bits for an LSB page.

In part (d) of FIG. 9, the page that the LSB represents has reliable bits at levels 0 and 7. Those bits are detected only if both MSB and CSB pages are known and store 1 at the same bit index.

Therefore, the maximum marking of reliable bits is achieved by first reading the page represented by the LSB with reference comparisons $Ref_{1-2}$, $Ref_{3-4}$, and $Ref_{5-6}$. The second and third pages to be read are the MSB and the CSB in any order. The neighbour page size information marks 50% of page bits as reliable for second and third pages.

Figure 10A:
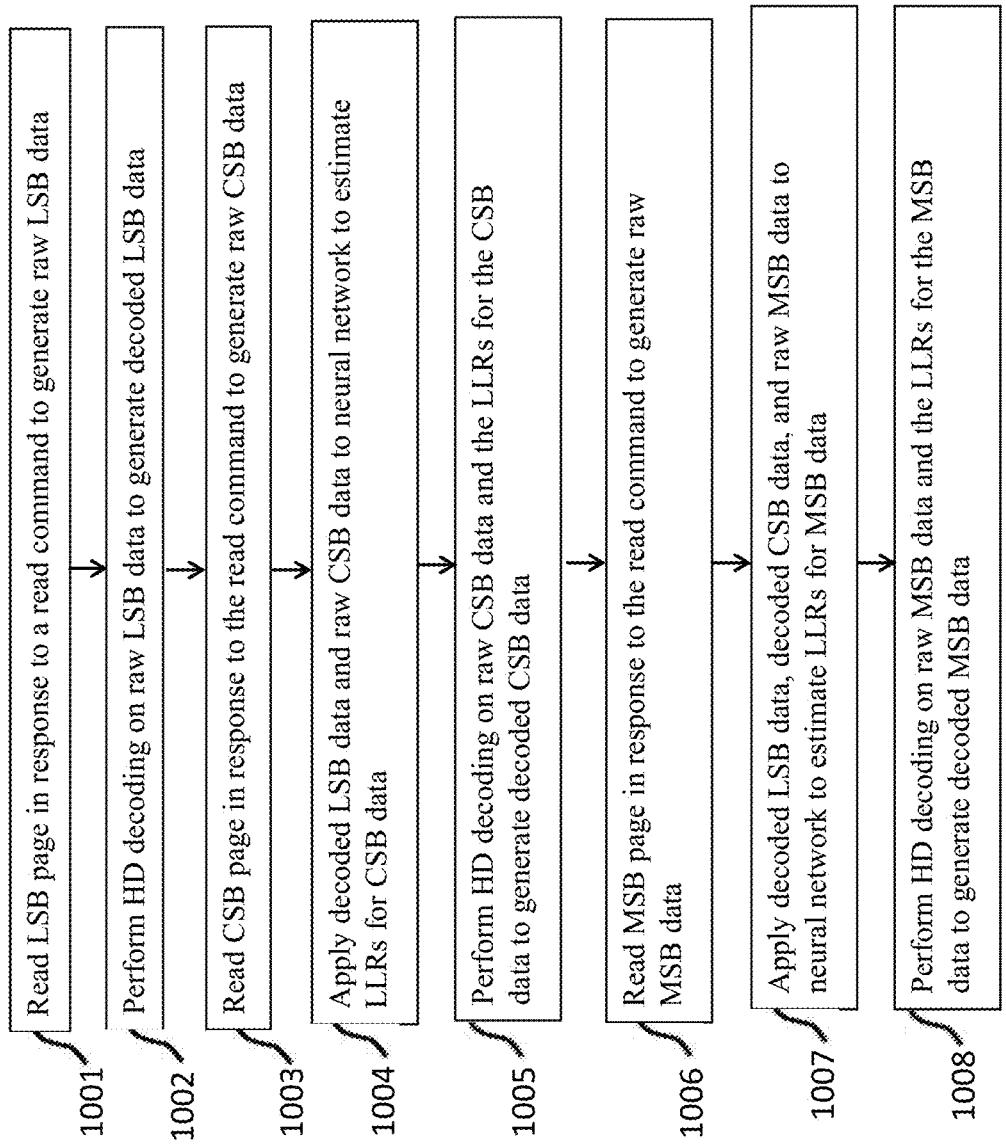
FIG. 10A illustrates a method of decoding data for 8-level memory cells, according to an exemplary embodiment of the inventive concept.

FIG. 10A illustrates a method of correcting data for 8-level TLCs according to an exemplary embodiment of the inventive concept and FIG. 10B illustrates pseudo-code for performing the method of FIG. 10A.

The method of FIG. 10A includes reading an LSB page in response to a read command to generate raw LSB data (step 1001). The read command may be received by the memory controller 210 from the Host along with a read address. The read address may indicate the location of the LSB page, a CSB page, and an MSB page of the memory device 220. The reading may correspond to step (1) of FIG. 10B. In an embodiment, the reading includes performing a first reference comparison $Ref_{1-2}$, a second reference comparison $Ref_{3-4}$, and a third reference comparison $Ref_{5-6}$ with respect to outputs of the memory device 220 output during the reading to generate the raw LSB data. The raw LSB data may corresponds to $RawP_1$ in FIG. 10B. The first reference comparison $Ref_{1-2}$ compares the read outputs to a voltage level between levels 1 and 2. The second reference comparison $Ref_{3-4}$ compares the read outputs to a voltage level between levels 3 and 4. The third reference comparison $Ref_{5-6}$ compares the read outputs to a voltage level between levels 5 and 6. The reading may be performed by the controller core 121 or the memory control core 122.

The method of FIG. 10A further includes performing hard decision (HD) decoding on the raw LSB data to generate decoded LSB data (S1002). The HD decoding may correspond to step (2) of FIG. 10B. In an exemplary embodiment, the HD decoding decodes the LSB data using a default LLR. The decoded LSB data may corresponds to $DataP_1$ in FIG. 10B. The HD decoding may be performed by the controller core 121 or the memory control core 122. For example, the memory control core 122 may include a decoder circuit or a decoder algorithm that is configured to perform the HD decoding by performing an iterative decoding on codes such as generalized low-density parity-check (GLDPC) codes.

The method of FIG. 10A further includes reading a CSB page in response to the read command to generate raw CSB data (step 1003). The reading may correspond to step (3) of FIG. 10B. In an embodiment, the reading includes performing a fourth reference comparison $Ref_{2-3}$ and a fifth reference comparison $Ref_{6-7}$ with respect to the read outputs to generate the raw CSB data. The raw CSB data may corresponds to $RawP_2$ in FIG. 10B. The fourth reference comparison $Ref_{2-3}$ compares the read outputs to a voltage level between levels 2 and 3. The fifth reference comparison $Ref_{6-7}$ compares the read outputs to a voltage level between levels 6 and 7. The reading may be performed by the controller core 121 or the memory control core 122.

The method of FIG. 10A includes applying the decoded LSB data and the raw CSB data as inputs to a neural network to estimate LLRs for the CSB data (step 1004). Step (4) of FIG. 10B may correspond to the application of the inputs to the neural network. The estimated LLRs of the CSB data may corresponds to llrP$_2$ in FIG. 10B. For example, if the CSB data includes 32 bits of data, then 32 LLRs or one for each bit may be output by the neural network. The machine learning core 123 may receive the decoded LSB data and the raw CSB data from the memory control core 122 and apply them as inputs to the neural network.

The method of FIG. 10A includes performing HD decoding on the raw CSB data and the LLRs of the CSB data to generate decoded CSB data (step 1005). The HD decoding may correspond to step (5) of FIG. 10B. In an exemplary embodiment, the HD decoding decodes the CSB data using the LLRs llrP$_2$ received from the machine learning core 123. The decoded CSB data may corresponds to DataP$_2$ in FIG. 10B. The HD decoding may be performed by the controller core 121 or the memory control core 122.

The method of FIG. 10A further includes reading an MSB page in response to the read command to generate raw MSB data (step 1006). The reading may correspond to step (6) of FIG. 10B. In an embodiment, the reading includes performing a sixth reference comparison Ref$_{0-1}$ and a seventh reference comparison Ref$_{4-5}$ with respect to the read outputs to generate the raw MSB data. The raw MSB data may corresponds to RawP$_3$ in FIG. 10B. The sixth reference comparison Ref$_{0-1}$ compares the read outputs to a voltage level between levels 0 and 1. The seventh reference comparison Ref$_{4-5}$ compares the read outputs to a voltage level between levels 4 and 5. The reading may be performed by the controller core 121 or the memory control core 122.

The method of FIG. 10A includes applying the decoded LSB data, the decoded CSB data, and the raw MSB data as inputs to a neural network to estimate LLRs for the MSB data (step 1007). Step (7) of FIG. 10B may correspond to the application of the inputs to the neural network. The estimated LLRs of the MSB data may corresponds to llrP$_3$ in FIG. 10B. For example, if the MSB data includes 32 bits of data, then 32 LLRs or one for each bit may be output by the neural network. The machine learning core 123 may receive the decoded LSB data, the decoded CSB data, and the raw MSB data from the memory control core 122 and apply them as inputs to the neural network.

The method of FIG. 10A includes performing HD decoding on the raw MSB data and the LLRs of the MSB data to generate decoded MSB data (step 1008). The HD decoding may correspond to step (8) of FIG. 10B. In an exemplary embodiment, the HD decoding decodes the MSB data using the LLRs llrP$_3$ received from the machine learning core 123. The decoded MSB data may corresponds to DataP$_3$ in FIG. 10B. The HD decoding may be performed by the controller core 121 or the memory control core 122.

The reading of the CSB data (step 1003) and the MSB data (step 1006) may be performed prior to the step 1002 of performing the HD decoding on the raw LSB data.

Assuming the HD decodings were successful, the decoded LSB, CSB, and MSB data then be output to the Host through the Host Interface Block 125. If only some of the data was decoded successfully, the memory controller 210 may log an error or output the error to the Host.

Figure 11A:
FIG. 11A illustrates features that may be input to a neural network during the decoding method, according to an exemplary embodiment of the inventive concept.

FIG. 11A shows an example of the neural network, and the features that may be applied to the neural network as input, and the outputs of the neural network. In an embodiment, the features include decoded data for at least one neighbour page and raw data (before decoding) for another neighbour page.

When the memory cells are 4-level cells, the decoded data for the at least one neighbour page is decoded data of a single first page such as the MSB page and the raw data of the neighbor page is data of a single second page that is adjacent to the first page such as the LSB page. In an alternate embodiment, the decoded data of the first page is the LSB page and the raw data of the second page is the MSB page.

When the memory cells are 8-level cells, two runs through the neural network (NN) is needed to decode all the pages. In the first run, the decoded data for the at least one neighbour page is decoded data for a single first page such as the LSB page and the raw data of the other neighbour page is raw data of the CSB page. In the second run, the decoded data for the at least one neighbour page is decoded data of two adjacent pages such as the LSB page and the CSB page, and the raw data of the other neighbour page is a single third page that is adjacent to one of the two adjacent pages such as the MSB page. In an alternate embodiment, the decoded data of the first page is the MSB page and the raw data of the third page is the LSB page. The two adjacent pages may be referred to as a page, where each of the two adjacent pages may be referred as sub-pages of the page.

The inventive concept may also be applied to QLCs and PLCs. When the memory device 220 includes QLCs, steps 1006-1008 of FIG. 10A may be adjusted so that they are applied to a second CSB page that is adjacent to the first CSB page referenced in steps 1003-1005 so that step S1008 decodes raw second CSB data, step 1006 can be applied to read the MSB page, and then the decoded LSB data, the decoded first and second CSB data, and the raw MSB data can be applied to the neural network to decode the MSB data. When the memory device 220 includes PLCs, a similar adjustment can be made to the method of FIG. 10A so that the additional CSB page is processed.

The neural network is trained using training data prior to its above use to infer an LLR from the input features. The training data may include example pairs of the decoded data for at least one neighbour page and raw data for another neighbor page marked to indicate a particular LLR. The weights of the neural network may be tuned so that an input training data example causes the neural network to output its marked LLR. A different neural network may be used based on the type of memory such as DLC (or MLC), TLC, QLC, and PLC. For example, a neural network designed to handle DLC or MLC may be configured to receive 2 features such as the decoded first page data and the raw second page data, a neural network designed to handle TLC may be configured to receive 3 features such as the decoded data of the first and second pages and the raw third page data.

Figure 11B:
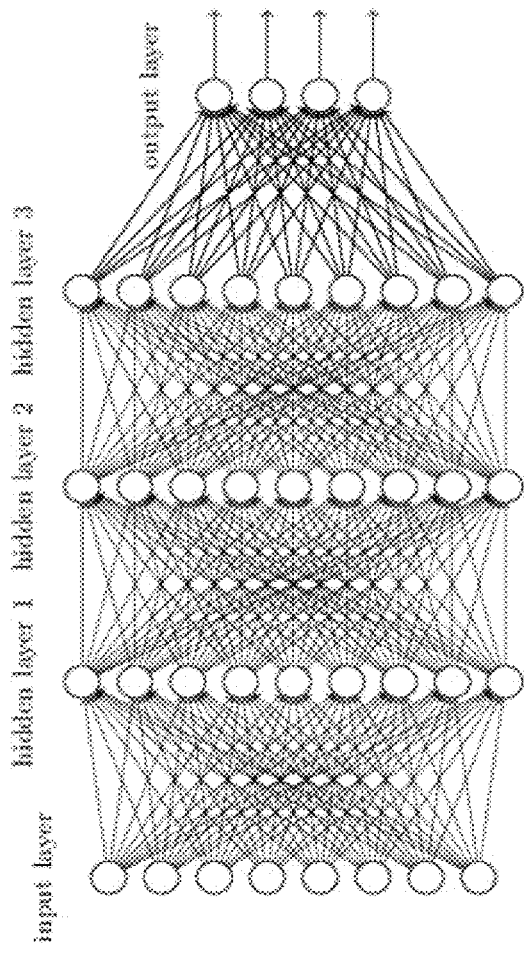
FIG. 11B is a diagram illustrating an exemplary structure of the neural network.

FIG. 11B illustrates one way to implement the neural network as an example. In this example, there are 2 hidden layers, an input layer, and an output layer. For example, if the neural network was trained on 3 features, then the input layer would include three nodes, where each one receives a different one of the three features. The output layer of the neural network may include one output node for each bit of the page date. For example, when each page is 32 bits, the neural network includes thirty two output nodes, where each outputs a distinct LLR for each bit of a page. However, the inventive concept is not limited to this specific neural network, and may be implemented by a neural network having various other configurations such as a convolutional neural network. Further, the neural network could also be replaced by various other machine learning architectures or algorithms.

Figure 12:
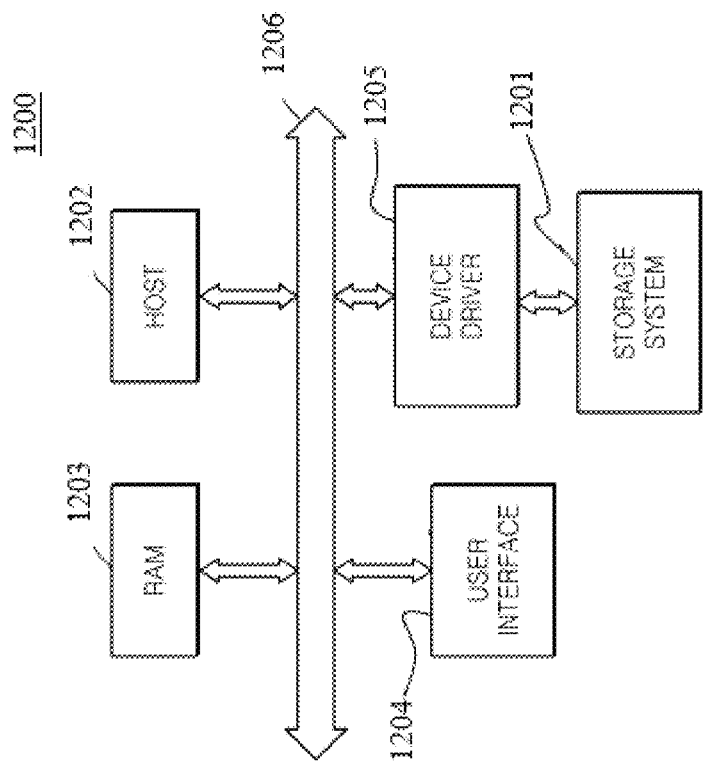
FIG. 12 is a block diagram of a computing system including a non-volatile memory system, according to an exemplary embodiment of the inventive concept.

FIG. 12 is a block diagram of a computing system 1200 including a non-volatile memory system, according to an exemplary embodiment of the inventive concept.

The non-volatile memory system in FIG. 12 may be the memory system 200 illustrated in FIG. 1. In the computing system 1200, which may be, for example, a mobile device or a desktop computer, the non-volatile memory system may be mounted as a non-volatile storage system 1201, however exemplary embodiments are not limited thereto.

The computing system 1200 may include, for example, a host 1202 including a CPU, a RAM 1203, a user interface 1204, and a device driver 1205. The host 1202 may be the host 100 illustrated in FIG. 1, and the device driver 1205 may be the memory device driver 111 illustrated in FIG. 1. These elements are electrically connected to a bus 1206. The non-volatile storage system 1201 may be connected to the device driver 1205. The host 1202 may control the entire computing system 1200 and perform an operation corresponding to a user command input through the user interface 1204. The RAM 1203 may function as a data memory of the host 1202. The host 1202 may write user data to or read user data from the non-volatile storage system 1201 through the device driver 1205. In FIG. 12, the device driver 1205 that controls the operation and management of the non-volatile storage system 1201 is illustrated as being disposed outside the host 1202, however exemplary embodiments are not limited thereto. For example, in an exemplary embodiment, the device driver 1205 may be disposed inside the host 1202.

In exemplary embodiments of the present inventive concept, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

Exemplary embodiments of the present invention may be embodied directly in hardware, in a software module executed by a processor, or in a combination of the two. A software module may be tangibly embodied on a non-transitory program storage device such as, for example, in RAM memory, flash memory, ROM memory, EPROM memory, EEPROM memory, registers, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an application specific integrated circuit (ASIC).

At least one embodiment of the inventive concept when applied to GLDPC codes, DLC (or MLC) memory cells, and two adjacent pages that share a same wordline, one page may be decoded with half as much energy, and the overall power saving may reach at least 23%. At least one embodiment of the inventive concept when applied to GLDPC codes, TLC memory cells, and three adjacent pages that share a same wordline, two pages may be decoded with half as much energy, and the overall power saving may reach at least 30%. Further, in some embodiments, 10/11 writes can be performed with reduced power using decoding with neighbour page side information, where the overall power savings in SSD write operations is at least 21% in DLC (or MLC) cells and at 27% in TLC cells. Since at least one embodiment of the inventive concept provides HD decoding with machine-learning (ML) assisted LLR estimated, greater GLDPC power may be saved as the number of bits per cell increases and as the codes are designed to tolerate more errors.

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A memory system, comprising:
a memory device comprising a plurality of memory cells each storing multiple bits; and
a memory controller comprising a processor,
wherein the memory controller is configured to read outputs from the memory cells in response to a read command from a host to generate first raw data of a first page and second raw data of a second page adjacent to the first page,
wherein the memory controller is further configured to perform a hard decision (HD) decoding on the first raw data to generate first decoded data, wherein the processor is configured to apply the first decoded data and the second raw data as input features to a machine learning algorithm to generate reliability information, and wherein the memory controller is further configured to perform a HD decoding on the second raw data using the reliability information to generate second decoded data.

2. The memory system of claim 1, wherein the reliability information includes at least one log-likelihood-ratio (LLR) of a bit of the second raw data.

3. The memory system of claim 1, wherein the machine learning algorithm is a neural network.

4. The memory system of claim 1, wherein the memory cells are double-level cells (DLCs), triple-level cells (TLCs), quad-level levels (QLCs), or penta-level cells (PLCs).

5. The memory system of claim 4, the memory controller generates the first raw data by performing a first reference comparison with respect to first and second adjacent levels and a second reference comparison with respect to third and fourth adjacent levels, and generates the second raw data by performing a third reference comparison with respect to the second and third levels, when the memory cells are the DLCs.

6. The memory system of claim 1, wherein the memory controller is configured to output the first decoded data and the second decoded data to the host.

7. The memory system of claim 1, wherein the memory controller performs the HD decoding on the first raw data using a default log-likelihood-ratio (LLR).

8. A computer-implemented method for controlling a memory system comprising a memory device having a plurality of memory cells each storing multiple bits, and a memory controller including a processor, the method comprising:

reading, by the memory controller, outputs from the memory cells in response to a read command from a host to generate first raw data of a first page and second raw data of a second page adjacent to the first page;

performing, by the memory controller, a hard decision (HD) decoding on the first raw data to generate first decoded data;

applying, by the processor, the first decoded data and the second raw data as input features to a machine learning algorithm to generate reliability information; and performing, by the memory controller, a hard decision (HD) decoding on the second raw data using the reliability information to generate second decoded data.

9. The computer-implemented method of claim 8, wherein the reliability information includes at least one log-likelihood-ratio (LLR) of a bit of the second raw data.

10. The computer-implemented method of claim 8, wherein the machine learning algorithm is a neural network.

11. The computer-implemented method of claim 8, wherein the memory cells are double-level cells (DLCs), triple-level cells (TLCs), quad-level levels (QLCs), or penta-level cells (PLCs).

12. The computer-implemented method of claim 8, wherein the reading comprises:

performing a first reference comparison of the outputs with respect to first and second adjacent levels and a second reference comparison with respect to third and fourth adjacent levels to generate the first raw data; and performing a third reference comparison of the outputs with respect to the second and third levels to generate the first raw data.

13. The computer-implemented method of claim 8, further comprising the memory controller outputting the first decoded data and the second decoded data to the host.

14. The computer-implemented method of claim 8, wherein the memory controller performs the HD decoding on the first raw data using a default log-likelihood-ratio (LLR).

15. A memory system, comprising:

a memory device comprising a plurality of triple-level memory cells (TLCs); and a memory controller comprising a processor, wherein the memory controller is configured to read outputs from the memory cells in response to a read command from a host to generate first raw data of a first page, second raw data of a second page adjacent to the first page, and third raw data of a second page adjacent to the first page, wherein the memory controller is further configured to perform a first decoding on the first raw data to generate first decoded data, wherein the processor is configured to apply the first decoded data and the second raw data as input features to a first machine learning algorithm to generate first reliability information, wherein the memory controller is further configured to perform a second decoding on the second raw data using the first reliability information to generate second decoded data, and wherein the processor is configured to apply the first decoded data, the second decoded data, and the third raw data as input features to a second machine learning algorithm to generate second reliability information for use in decoding the third raw data.

16. The memory system of claim 15, wherein the first and second decoding are performed using hard decision (HD) decoding.

17. The method system of claim 15, wherein the memory cells store data in one of first to eighth levels and the memory controller generates the first raw data by performing a first reference comparison of the outputs with respect to the second and the third adjacent levels, performing a second reference comparison of the outputs with respect to the fourth and the fifth adjacent levels, and performing a third reference comparison of the outputs with respect to the sixth and the seventh adjacent levels.

18. The method system of claim 15, wherein the memory cells store data in one of first to eighth levels and the memory controller generates the second raw data by performing a first reference comparison of the outputs with respect to the third and the fourth adjacent levels and performing a second reference comparison of the outputs with respect to the seventh and the eighth adjacent levels.

19. The method system of claim 15, wherein the memory cells store data in one of first to eighth levels and the memory controller generates the third raw data by performing a first reference comparison of the outputs with respect to the first and the second adjacent levels and performing a second reference comparison of the outputs with respect to the fifth and the sixth adjacent levels.

20. The method system of claim 15, wherein the first reliability information and the second reliability information each include at least one log-likelihood-ratio (LLR).

* * * * *